United States Patent
Chung et al.

(10) Patent No.: US 12,489,433 B2
(45) Date of Patent: Dec. 2, 2025

(54) SIGNAL TRANSMISSION DEVICE, METHOD, AND TIME-OF-FLIGHT DISTANCE MEASURING DEVICE CAPABLE OF ACCURATELY MAINTAINING DELAY AMOUNT OF DELAY UNIT

(71) Applicant: PixArt Imaging Inc., Hsin-Chu (TW)

(72) Inventors: Yueh-Lin Chung, Hsin-Chu (TW); Tso-Sheng Tsai, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 173 days.

(21) Appl. No.: 18/495,774

(22) Filed: Oct. 27, 2023

(65) Prior Publication Data

US 2025/0141439 A1    May 1, 2025

(51) Int. Cl.
*H03K 5/133* (2014.01)
*H03K 3/03* (2006.01)
*H03K 3/354* (2006.01)
*H03K 5/131* (2014.01)

(52) U.S. Cl.
CPC ............ *H03K 5/133* (2013.01); *H03K 3/0315* (2013.01); *H03K 3/354* (2013.01); *H03K 5/131* (2013.01)

(58) Field of Classification Search
None
See application file for complete search history.

(56) References Cited

U.S. PATENT DOCUMENTS

| 6,928,128 B1 * | 8/2005 | Sidiropoulos ......... H03L 7/0812 327/158 |
| 2004/0090889 A1 * | 5/2004 | Okada .................... G11B 7/126 369/47.28 |

* cited by examiner

*Primary Examiner* — Cassandra F Cox
(74) *Attorney, Agent, or Firm* — Winston Hsu

(57) ABSTRACT

A method of a signal transmission device includes: providing at least one delay line circuit having a plurality of first delay units connected in series; providing a control voltage as a supply voltage provided for a first delay unit of the at least one delay line circuit; and adjusting the control voltage to maintain a delay amount of the first delay unit at a specific delay amount when a variation of the delay amount of the first delay unit occurs.

18 Claims, 4 Drawing Sheets

A signal transmission device includes a delay line circuit and a delay control circuit to accurately maintain delay amount despite temperature and supply voltage changes.

SIGNAL TRANSMISSION DEVICE, METHOD, AND TIME-OF-FLIGHT DISTANCE MEASURING DEVICE CAPABLE OF ACCURATELY MAINTAINING DELAY AMOUNT OF DELAY UNIT

BACKGROUND OF THE INVENTION

1. Field of the Invention

The invention relates to a signal transmission mechanism, and more particularly to a signal transmission device, a method of the signal transmission device, and a time-of-flight distance measuring device.

2. Description of the Prior Art

Generally speaking, a conventional time-of-flight distance measuring device emits light rays and sense reflected light rays from an object to be detected to detect and measure the distance. However, the accuracy of the detection operation of the conventional time-of-flight distance measuring device is easily affected by the ambient temperature change and/or the system supply voltage change due to that the signal delay amount of the circuit components within the conventional time-of-flight distance measuring device will vary with the ambient temperature change and/or the system supply voltage change.

SUMMARY OF THE INVENTION

Therefore one of the objectives of the invention is to provide a signal transmission device, a method of the signal transmission device, and a time-of-flight distance measuring device, to solve the problems.

According to embodiments of the invention, a signal transmission device is disclosed. The signal transmission device comprises at least one delay line circuit and a delay control circuit. The at least one delay line circuit comprises a plurality of first delay units connected in series. The delay control circuit is coupled to the at least one delay line circuit, and it is used for providing a control voltage as a supply voltage provided for a first delay unit of the at least one delay line circuit and for adjusting the control voltage to maintain a delay amount of the first delay unit at a target delay amount when a variation of the delay amount of the first delay unit occurs.

According to the embodiments, a method of a signal transmission device is disclosed. The method comprises: providing at least one delay line circuit having a plurality of first delay units connected in series; providing a control voltage as a supply voltage provided for a first delay unit of the at least one delay line circuit; and adjusting the control voltage to maintain a delay amount of the first delay unit at a specific delay amount when a variation of the delay amount of the first delay unit occurs.

According to the embodiments, a time-of-flight distance measuring device is disclosed. The time-of-flight distance measuring device comprises an illumination circuit, a pixel array, a distance measuring circuit, and a signal transmission device. The illumination circuit emits a light ray into an object to be measured according to a modulation signal. The pixel array is used for sensing a reflected light ray from the object to be measured according to a modulation signal so as to generate a reception signal. The distance measuring circuit is coupled to the illumination circuit and the pixel array, and it is used for generating the modulation signal and for receiving the reception signal to perform a distance calculation based on the reception signal and the modulation signal to obtain a distance measurement result. The signal transmission device is displaced and coupled between the illumination circuit and the distance measuring circuit, displaced and coupled between the pixel array and the distance measuring circuit, and it comprises at least one delay line circuit and a delay control circuit. The at least one delay line circuit comprises a plurality of first delay units connected in series, and it used for delaying and transmitting the modulation signal into the illumination circuit and the pixel array. The delay control circuit is coupled to the at least one delay line circuit, and it is used for providing a control voltage as a supply voltage provided for a first delay unit of the at least one delay line circuit and for adjusting the control voltage to maintain a delay amount of the first delay unit at a specific delay amount when a variation of the delay amount of the first delay unit occurs.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution of a delay control circuit, a time-of-flight (TOF) distance measuring device, and a corresponding method capable of accurately maintaining or keeping the signal transmission delay at the same level without being affected by the environment/ambient temperature change and/or power supply voltage change.

Figure 1:
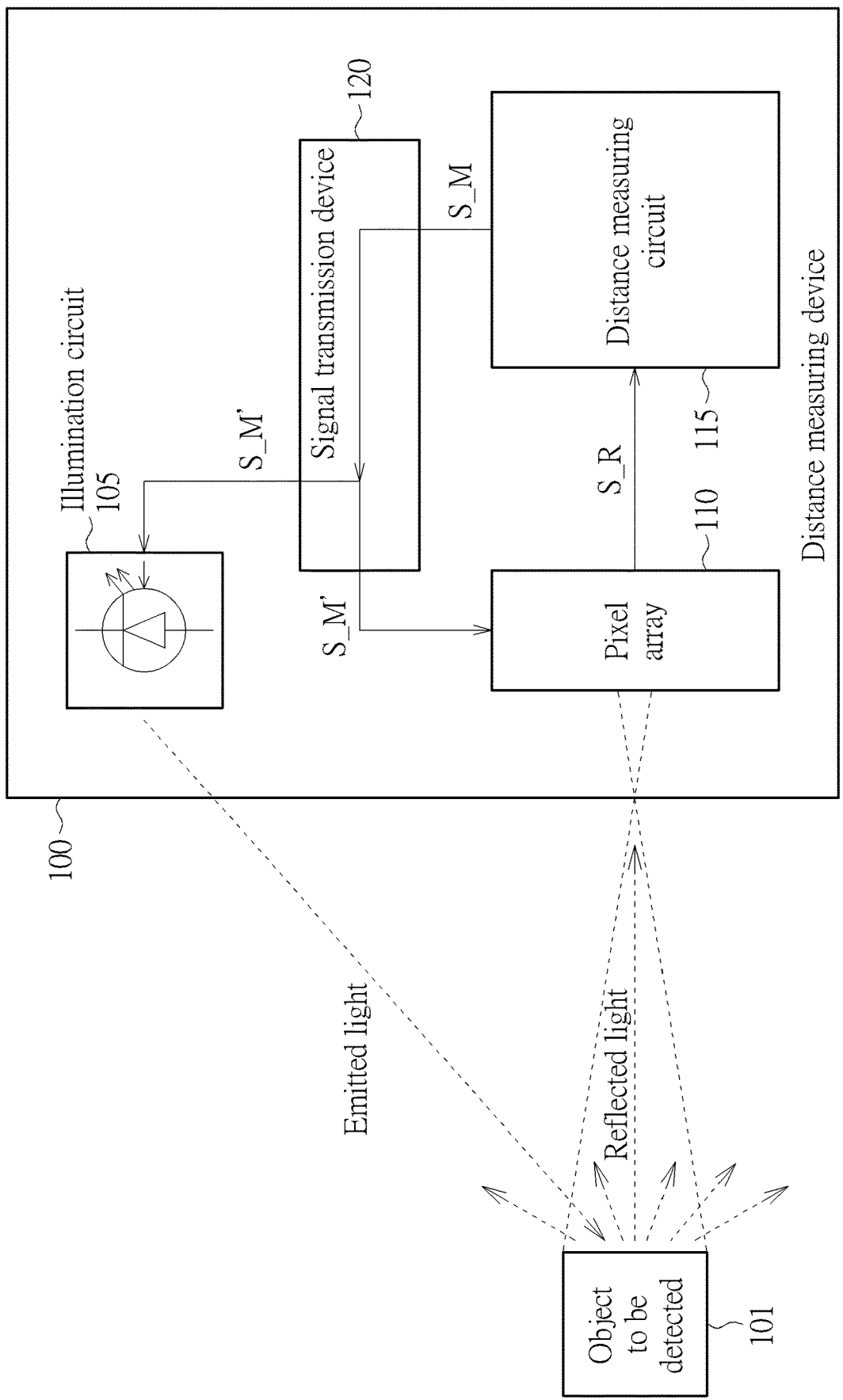
FIG. 1 is a block diagram of the distance measuring device such as a TOF distance measuring device according to an embodiment of the invention.

FIG. 1 is a block diagram of the distance measuring device 100 such as a TOF distance measuring device according to an embodiment of the invention. The distance measuring device 100 for example can be used for detecting and measuring the actual distance value between the distance measuring device d 100 and an object 101 to be detected/measured by emitting a light ray and sensing the reflected light ray from the object to be detected/measured. In practice, the distance measuring device 100 may comprise an illumination circuit 105 such as a light emitting diode (but not limited), a receiving circuit such as a pixel array 110, a distance measuring circuit 115, and a signal transmission device 120.

The distance measuring circuit 115 for example comprises a timing generator and an analog-to-digital converter (ADC), which are not shown in FIG. 1, and it is arranged to generate and output a modulation signal S_M into the signal transmission device 120. The signal transmission device 120 is used to apply a specific delay amount upon the modulation signal S_M and then transmit the delayed modulation signal S_M' into the illumination circuit 105 and the pixel array 110 respectively so as to trigger and make the illumination circuit 105 emit light rays into a surface of the object 101 to be detected and make the pixel array 110 receive and sense reflected light rays from the surface of the object 101.

The illumination circuit 105 is used to illuminate or emit light rays into the object 101 to be measured according to the delayed modulation signal S_M', and the pixel array 110 is used to receive and sense the reflected light rays from the object 101 to be measured according to the delayed modulation signal S_M' so as to generate a reception signal S_R into the distance measuring circuit 115. The distance measuring circuit 115 then receives the reception signal S_R from the pixel array 110 to perform the distance calculation based on the modulation signal S_M and the reception signal S_R to generate and obtain a distance measurement result which indicates the detected./measured distance value from the object 101 to the distance measuring device 100.

In this embodiment, the signal transmission device 120 is disposed between the illumination circuit 105, pixel array 110, and the distance measuring circuit 115, and it can be used to maintain or keep the applied specific delay amount at a specific level such as a substantially identical level even though an operating condition varies such as a temperature variation occurs and/or a variation of a power supply voltage occurs.

Figure 2:
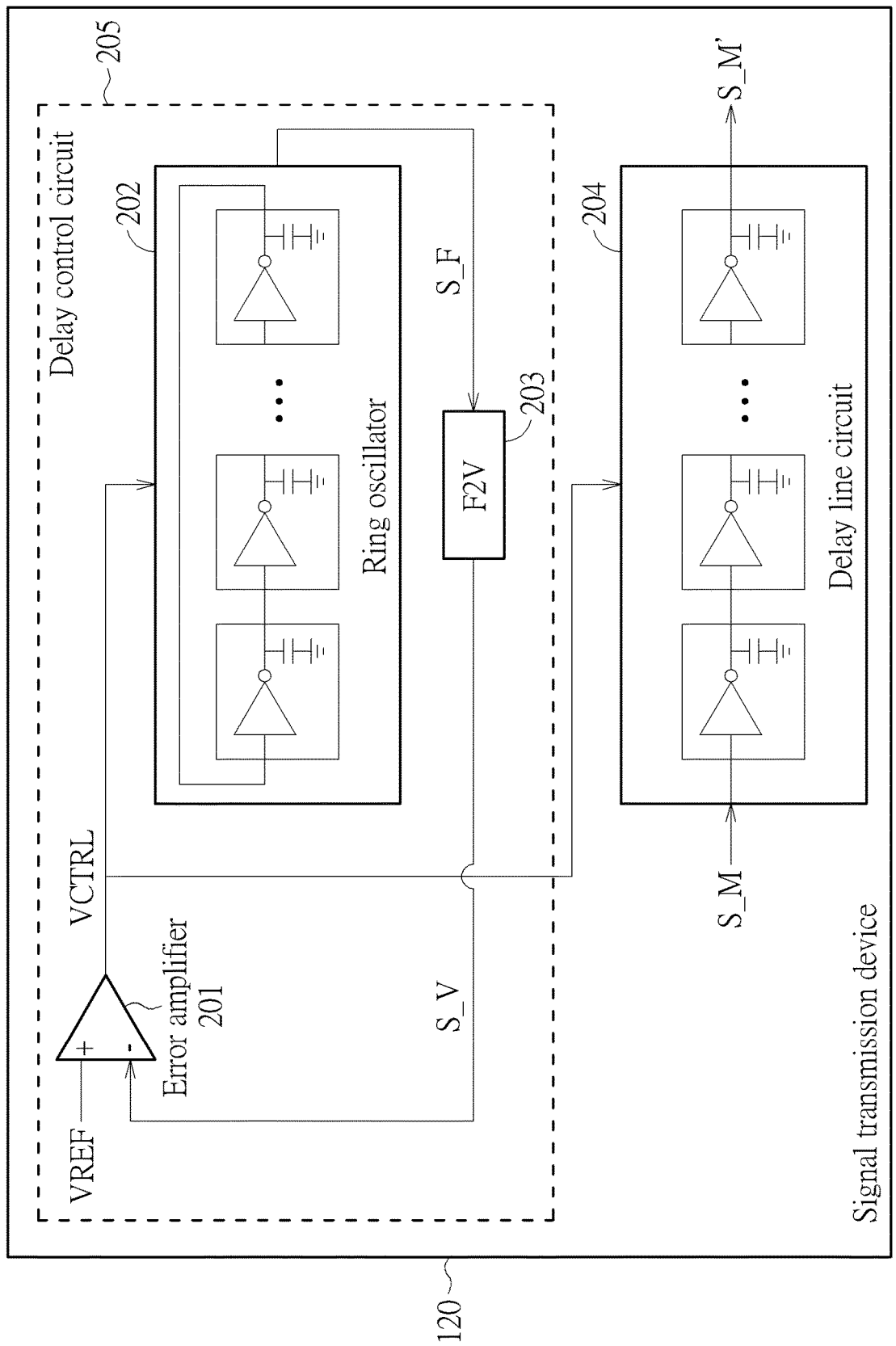
FIG. 2 is a circuit diagram of the signal transmission device according to an embodiment of the invention.

FIG. 2 is a circuit diagram of the signal transmission device 120 according to an embodiment of the invention. In FIG. 2, the signal transmission device 120 for example comprises a delay control circuit 205 and at least one delay line circuit 204. The at least one delay line circuit 204 is used to delay the modulation signal S_M to generate and output the delayed modulation signal S_M', and the delay control circuit 205 is used to provide a control voltage VCTRL as the supply voltage for each delay unit within the at least one delay line circuit 204 based on a frequency-locked loop mechanism/scheme so as to control and maintain the delay amount of the each delay unit within the at least one delay line circuit 204 no matter what operating conditions vary. In the embodiment, the delay units within the at least one delay line circuit 204 are connected in series as shown in FIG. 2, and each delay unit for example (but not limited) comprises an inverter and a capacitor.

In practice, for example, the delay control circuit 205 may comprise an error amplifier 201, a ring oscillator 202, and a frequency-to-voltage (F2V) converter 203. The error amplifier 201 comprises a first input (e.g. a positive input) coupled to a reference voltage VREF, a second input (e.g. a negative input) coupled to an output of the frequency-to-voltage converter 203, and an output which is used to generate the control voltage VCTRL as a supply voltage of the ring oscillator 202.

The ring oscillator 202 is used to generate an oscillation frequency signal S_F based on the control voltage VCTRL outputted from the error amplifier 201. For example, the ring oscillator 202 comprises a plurality of delay units having an odd number such as five (but not limited), and the odd-number delay units are arranged and connected in a ring. The delay units within the ring oscillator 202 are implemented and manufactured in the same process, and similarly each delay unit comprises an inverter and a capacitor. The frequency value of the generated oscillation frequency signal S_F is determined by the delay amount of the each delay unit within the ring oscillator 202, which is determined by the supply voltage (i.e. the control voltage VCTRL) provided into the each delay unit. That is, the frequency value corresponds to a delay amount of one delay unit among the plurality of delay units. For example, the frequency value becomes higher when the delay amount becomes shorter.

The frequency-to-voltage converter 203 is coupled to the error amplifier 201 and the ring oscillator 202, and it is used for converting the oscillation frequency signal S_F into the converted voltage S_V, using the converted voltage S_V as a feedback voltage, and providing the feedback voltage into the second input of the error amplifier 201.

Based on the circuit structure as shown in FIG. 2, the delay control circuit 205 equivalently may be used as a frequency locked loop circuit which can be used to track and lock a specific frequency value by adjusting/tuning the control voltage VCTRL to adjust the value of delay amount of at least one delay unit within the delay control circuit 205 to equivalently track and lock at the specific frequency value. When locking the specific frequency value, this equivalently indicates that the delay amount of each delay unit within the ring oscillator 202 is tracked and locked at a specific delay amount.

In practice, the ring oscillator 202 comprises odd-number delay units connected and arranged in a ring, and the frequency value of oscillation frequency signal S_F generated by and outputted from the ring oscillator 202 is inversely proportional to the delay amount of one delay unit within the ring oscillator 202. The number of the plurality of delay units within the ring oscillator 202 can be identical to or different from a number of the plurality of delay units of the delay line circuit 204; this is not intended to be a limitation of the invention.

For the operation, when the delay amount of a delay unit within the ring oscillator 202 varies due to a temperature variation and/or a supply voltage variation, a corresponding frequency shift is generated in the frequency value of oscillation frequency signal S_F and thus a converted voltage shift corresponding to the frequency shift is generated in the feedback voltage S_V, so that the error amplifier 201 can correspondingly adjust or tune the control voltage VCTRL based on the reference voltage VREF and the feedback voltage S_V having the converted voltage shift to calibrate the varied delay amount of such delay unit so as to maintain and lock the delay amount at a specific delay amount substantially. For example, if the delay amount of one delay unit varies from a target/predetermined delay amount to be a shorter delay amount, then the generated oscillation frequency will also be shifted into a higher frequency and thus the feedback voltage S_V will be shifted into a higher voltage level. In this situation, the error amplifier 201 calculates the difference between the fixed reference voltage VREF with the higher feedback voltage S_V to generate a lower control voltage VCTRL into the ring oscillator 202, and the shorter delay amount will be immediately calibrated back to the target/predetermined delay amount when the lower control voltage VCTRL is used as a supply voltage of the delay unit to make the transistor of the delay unit have a smaller conductance amount. Similarly, if the delay amount of one delay unit is shifted into a longer delay amount from the target/predetermined delay amount, then the generated oscillation frequency signal S_F will be shifted into a lower frequency and thus the feedback voltage S_V will be shifted into a lower voltage level. In this situation, the error amplifier 201 can generate a higher control voltage VCTRL into the ring oscillator 202, and the longer delay amount can be instantly calibrated into the target/predetermined delay amount.

Accordingly, based on the above-mentioned frequency-locked loop operation, the oscillation frequency of the ring oscillator 202 can be locked and kept at a fixed/target frequency value and will not significantly vary with the environment temperate change and/or the system power supply voltage change, and thus similarly the delay amount of each delay unit within the ring oscillator 202 can be locked and kept at a fixed/target delay width and will not significantly vary with the environment temperate change and/or the system power supply voltage change. Similarly, when the resultantly adjusted/tuned control voltage VCTRL is also provided for the delay units within the delay line circuit 204 at the same time as well as all the delay units within the ring oscillator 202 and within the delay line circuit 204 are manufactured based on the same process, the delay amount of each delay unit within the delay line circuit 204 can be also locked and kept at the fixed/target delay width and also will not significantly vary with the environment temperate change and/or the system power supply voltage change.

Figure 3:
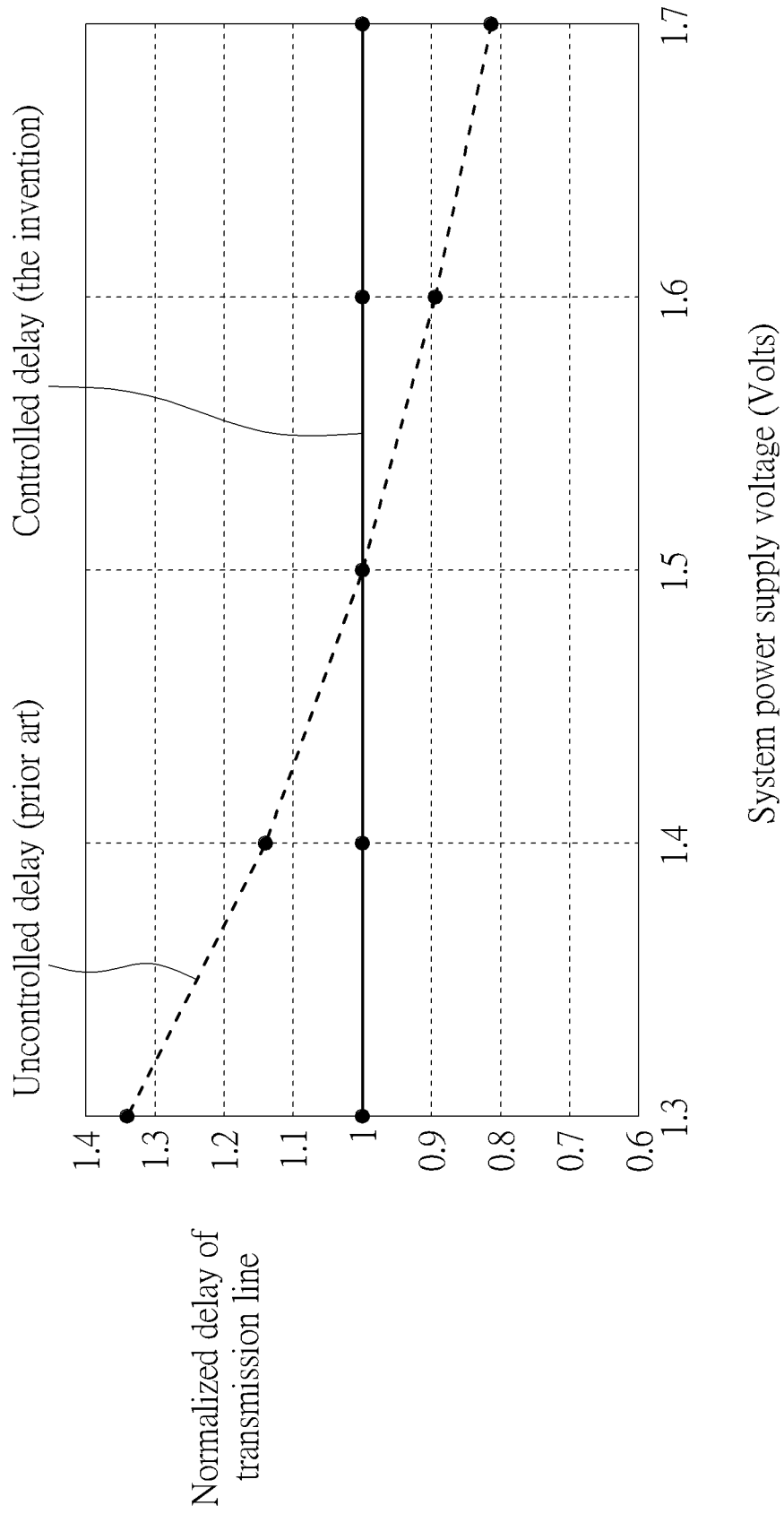
FIG. 3 is a diagram showing an example of the performance comparison between the provided distance measuring device and a conventional TOF distance measuring device.
Figure 4:
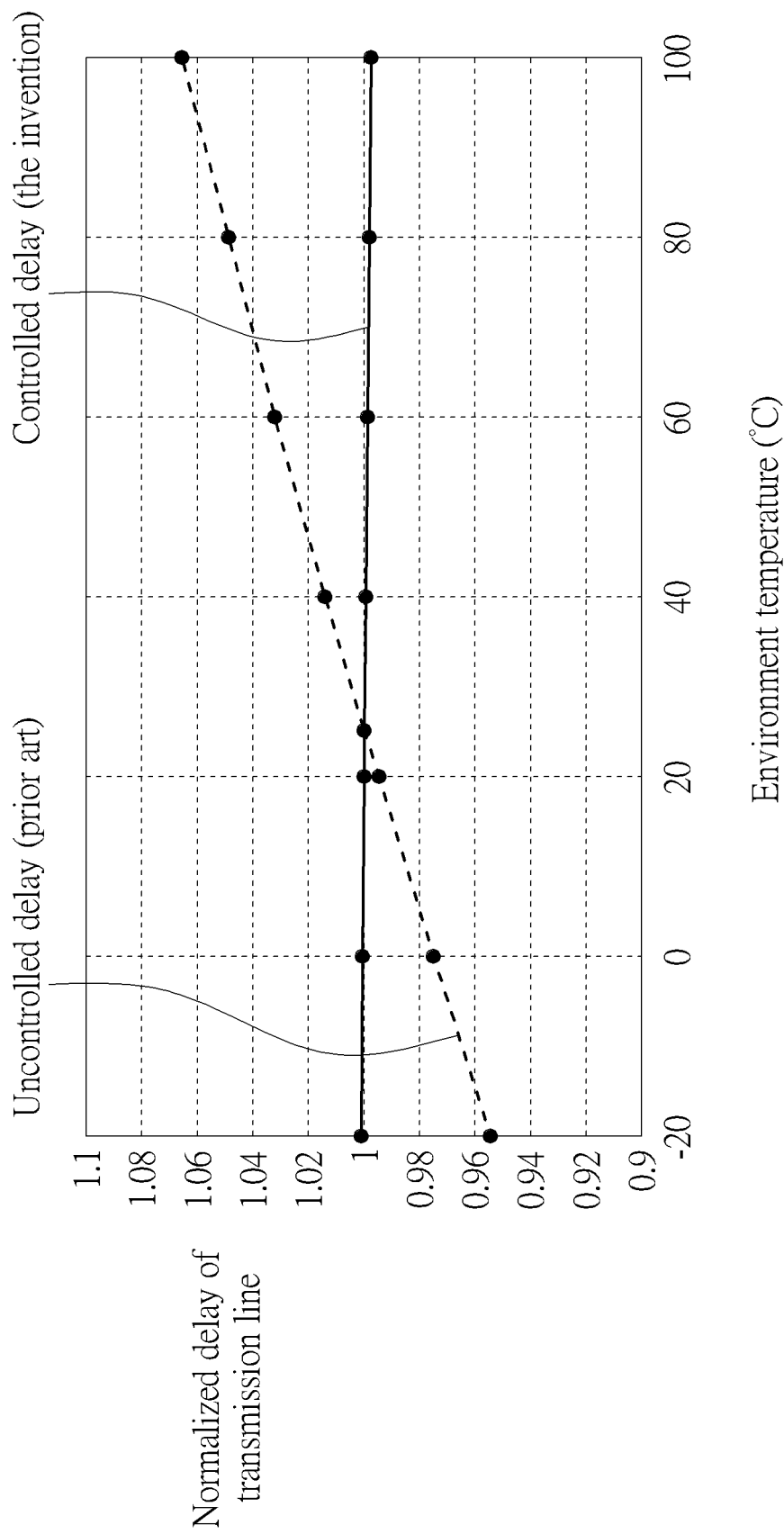
FIG. 4 is a diagram showing another example of the performance comparison between the provided distance measuring device and a conventional TOF distance measuring device.

Particularly, the signal transmission device 120 in FIG. 1 can control the and make the signal transmission time of the modulation signal S_M be at a substantially identical level no matter what condition varies, and thus the TOF distance measuring device 100 is capable of more accurately detecting and measuring the actual distance from the object 101 to the distance measuring device 100. FIG. 3 and FIG. 4 are diagrams showing the examples of the performance comparisons between the provided distance measuring device 100 and a conventional TOF distance measuring device. In FIG. 3, for example, when the system power supply voltage varies from 1.3 Volts to 1.7 Volts, the uncontrolled delay amount of a transmission line (e.g. a normalized delay amount of the transmission line) having multiple delay units within a conventional TOF distance measuring device significantly varies due to a delay drift, and it becomes shorter and shorter. In this situation, for the provided distance measuring device 100, the controlled delay amount of a transmission line (e.g. a normalized delay amount of the transmission line) having multiple delay units within the provided distance measuring device 100 can be calibrated and kept at the same level, i.e. it does not generate a delay drift.

Similarly, in FIG. 4, for example, when the environment temperature varies from –20° C. to 100° C., the uncontrolled delay amount of a transmission line (e.g. a normalized delay amount of the transmission line) having multiple delay units within a conventional TOF distance measuring device significantly varies, and it becomes longer and longer. In this situation, for the provided distance measuring device 100, the controlled delay amount of a transmission line (e.g. a normalized delay amount of the transmission line) having multiple delay units within the provided distance measuring device 100 can be calibrated and kept at the same level, i.e. it does not generate a delay drift.

The accuracy of the TOF distance measuring operation of the conventional TOF distance measuring device will be significantly affected due to the varied signal delay amount in its circuit components, and the accuracy of the TOF distance measuring operation of the provided TOF distance measuring device 100 will not be affected since the device 100 is capable of effectively maintaining and keeping the signal delay amount of its signal transmission line. Equivalently, the signal transmission device 120 can eliminate or reduce a distance measurement drift without using a reference pixel compared to the conventional TOF distance measuring device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transmission device, comprising:
at least one delay line circuit, comprising a plurality of first delay units connected in series; and
a delay control circuit, coupled to the at least one delay line circuit, for providing a control voltage as a supply voltage provided for a first delay unit of the at least one delay line circuit and for adjusting the control voltage to maintain a delay amount of the first delay unit at a target delay amount when a variation of the delay amount of the first delay unit occurs;
wherein the signal transmission device is a delay-locked loop device being used to lock the delay amount of the first delay unit, and the delay control circuit is a frequency-locked loop circuit and comprises:
an error amplifier, having a first input coupled to a reference voltage, a second input coupled to a converted voltage, and an output being used to generate the control voltage;
a ring oscillator, coupled to the error amplifier, for generating an oscillation frequency signal based on the control voltage outputted from the error amplifier; and
a frequency-to-voltage converter, coupled to the error amplifier and the ring oscillator, for converting the oscillation frequency signal into the converted voltage, using the converted voltage as a feedback voltage, and providing the feedback voltage into the error amplifier.

2. The signal transmission device of claim 1, wherein the ring oscillator comprises a plurality of second delay units connected in a ring, and a second delay unit of the plurality of second delay units and the first delay unit are manufactured in a same process.

3. The signal transmission device of claim 2, wherein when a delay variation occurs in the second delay unit, a frequency calibration amount is generated in the oscillation frequency signal, and a voltage calibration amount corresponding to the frequency calibration amount is provided by the error amplifier into the control voltage to make a delay amount of the second delay unit be calibrated back to the specific delay amount as well as to make the delay amount of the first delay unit be calibrated back to the specific delay amount.

4. The signal transmission device of claim 3, wherein the delay variation occurs due to a temperature variation or a variation of a power supply voltage provided to the signal transmission device.

5. The signal transmission device of claim 1, wherein a number of the plurality of second delay units is different from a number of the plurality of first delay units of the delay line circuit.

6. The signal transmission device of claim 1, wherein a delay unit comprises an inverter and a capacitor unit.

7. A method of a signal transmission device, comprising:
providing at least one delay line circuit having a plurality of first delay units connected in series;
providing a control voltage as a supply voltage provided for a first delay unit of the at least one delay line circuit;
adjusting the control voltage to maintain a delay amount of the first delay unit at a specific delay amount when a variation of the delay amount of the first delay unit occurs, the signal transmission device being a delay-locked loop device which is used to lock the delay amount of the first delay unit;

providing an error amplifier having a first input coupled to a reference voltage, a second input coupled to a converted voltage, and an output being used to generate the control voltage;

using a ring oscillator to generate an oscillation frequency signal based on the control voltage outputted from the error amplifier;

using a frequency-to-voltage converter to convert the oscillation frequency signal into the converted voltage;

using the converted voltage as a feedback voltage; and providing the feedback voltage into the error amplifier.

8. The method of claim 7, wherein the ring oscillator comprises a plurality of second delay units connected in a ring, and a second delay unit of the plurality of second delay units and the first delay unit are manufactured in a same process.

9. The method of claim 8, further comprising:

when a delay variation occurs in the second delay unit, generating a frequency calibration amount in the oscillation frequency signal, and providing a voltage calibration amount corresponding to the frequency calibration amount into the control voltage to make a delay amount of the second delay unit be calibrated back to the specific delay amount as well as to make the delay amount of the first delay unit be calibrated back to the specific delay amount.

10. The method of claim 9, wherein the delay variation occurs due to a temperature variation or a variation of a power supply voltage provided to the signal transmission device.

11. The method of claim 7, wherein a number of the plurality of second delay units is different from a number of the plurality of first delay units of the delay line circuit.

12. A time-of-flight distance measuring device, comprising:

an illumination circuit, for emitting a light ray into an object to be measured according to a modulation signal;

a pixel array, for sensing a reflected light ray from the object to be measured according to a modulation signal so as to generate a reception signal;

a distance measuring circuit, coupled to the illumination circuit and the pixel array, for generating the modulation signal and for receiving the reception signal to perform a distance calculation based on the reception signal and the modulation signal to obtain a distance measurement result; and a signal transmission device, displaced and coupled between the illumination circuit and the distance measuring circuit, displaced and coupled between the pixel array and the distance measuring circuit, comprising:

at least one delay line circuit, comprising a plurality of first delay units connected in series, for delaying and transmitting the modulation signal into the illumination circuit and the pixel array; and a delay control circuit, coupled to the at least one delay line circuit, for providing a control voltage as a supply voltage provided for a first delay unit of the at least one delay line circuit and for adjusting the control voltage to maintain a delay amount of the first delay unit at a specific delay amount when a variation of the delay amount of the first delay unit occurs.

13. The time-of-flight distance measuring device of claim 12, wherein the signal transmission device is a delay-locked loop device being used to lock the delay amount of the first delay unit, and the delay control circuit is a frequency-locked loop circuit and comprises:

an error amplifier, having a first input coupled to a reference voltage, a second input coupled to a converted voltage, and an output being used to generate the control voltage;

a ring oscillator, coupled to the error amplifier, for generating an oscillation frequency signal based on the control voltage outputted from the error amplifier; and a frequency-to-voltage converter, coupled to the error amplifier and the ring oscillator, for converting the oscillation frequency signal into the converted voltage, using the converted voltage as a feedback voltage, and providing the feedback voltage into the error amplifier.

14. The time-of-flight distance measuring device of claim 13, wherein the ring oscillator comprises a plurality of second delay units connected in a ring, and a second delay unit of the plurality of second delay units and the first delay unit are manufactured in a same process.

15. The time-of-flight distance measuring device of claim 14, wherein when a delay variation occurs in the second delay unit, a frequency calibration amount is generated in the oscillation frequency signal, and a voltage calibration amount corresponding to the frequency calibration amount is provided by the error amplifier into the control voltage to make a delay amount of the second delay unit be calibrated back to the specific delay amount as well as to make the delay amount of the first delay unit be calibrated back to the specific delay amount.

16. The time-of-flight distance measuring device of claim 15, wherein the delay variation occurs due to a temperature variation or a variation of a power supply voltage provided to the signal transmission device.

17. The time-of-flight distance measuring device of claim 13, wherein a number of the plurality of second delay units is different from a number of the plurality of first delay units of the delay line circuit.

18. The time-of-flight distance measuring device of claim 13, wherein a delay unit comprises an inverter and a capacitor unit.

* * * * *